United States Patent
Zhou

(10) Patent No.: US 10,269,972 B2
(45) Date of Patent: Apr. 23, 2019

(54) FIN-FET DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 8 days.

(21) Appl. No.: 15/726,183

(22) Filed: Oct. 5, 2017

(65) Prior Publication Data

US 2018/0102437 A1    Apr. 12, 2018

(30) Foreign Application Priority Data

Oct. 10, 2016 (CN) .......................... 2016 1 0884434

(51) Int. Cl.
*H01L 21/324* (2006.01)
*H01L 27/092* (2006.01)
(Continued)

(52) U.S. Cl.
CPC .... *H01L 29/7856* (2013.01); *H01L 21/28123* (2013.01); *H01L 21/31144* (2013.01);
(Continued)

(58) Field of Classification Search
CPC ............. H01L 29/785; H01L 29/42392; H01L 29/41791; H01L 29/66795; H01L 21/283;
(Continued)

(56) References Cited

U.S. PATENT DOCUMENTS

| 6,678,640 B2* | 1/2004 | Ishida ................. F02D 41/1405 |
| | | 702/181 |
| 2013/0328162 A1* | 12/2013 | Hu ....................... H01L 27/0629 |
| | | 257/526 |

(Continued)

FOREIGN PATENT DOCUMENTS

CN         105097527 A      11/2015

OTHER PUBLICATIONS

The European Patent Office (EPO) The Extended European Search Report for 17195549.5 dated Feb. 7, 2018 17 Pages.

*Primary Examiner* — Brian Turner
(74) *Attorney, Agent, or Firm* — Anova Law Group, PLLC

(57) ABSTRACT

A Fin-FET device and its fabrication method are provided. The method for fabricating the Fin-FET device includes forming a plurality of fin structures on a substrate, forming an isolation film on the substrate between neighboring fin structures, removing a portion of the isolation film to form an initial isolation layer with a top surface of the initial isolation layer lower than top surfaces of the fin structures, and implanting doping ions into the initial isolation layer. Further, the method also includes removing a portion of the initial isolation layer to form an isolation layer.

20 Claims, 6 Drawing Sheets

(51) Int. Cl.
*H01L 29/06* (2006.01)
*H01L 29/167* (2006.01)
*H01L 21/265* (2006.01)
*H01L 21/225* (2006.01)
*H01L 29/78* (2006.01)
*H01L 21/28* (2006.01)
*H01L 21/311* (2006.01)
*H01L 21/3215* (2006.01)
*H01L 29/66* (2006.01)
*H01L 21/8238* (2006.01)
*H01L 21/60* (2006.01)

(52) U.S. Cl.
CPC .. *H01L 21/3215* (2013.01); *H01L 21/823821* (2013.01); *H01L 29/66803* (2013.01); *H01L 29/7833* (2013.01); *H01L 29/7843* (2013.01); *H01L 2021/6006* (2013.01)

(58) Field of Classification Search
CPC ............ H01L 29/665; H01L 29/66545; H01L 2029/7858; H01L 29/165
See application file for complete search history.

(56) References Cited

U.S. PATENT DOCUMENTS

| | | |
|---|---|---|
| 2014/0264485 A1 | 9/2014 | Li et al. |
| 2014/0374838 A1* | 12/2014 | Chen ................... H01L 27/0886 257/401 |
| 2015/0129891 A1 | 5/2015 | Lin et al. |
| 2016/0218199 A1 | 7/2016 | Tsai et al. |
| 2016/0225771 A1* | 8/2016 | Wu ................. H01L 21/823821 |
| 2017/0011995 A1* | 1/2017 | Chung ............. H01L 27/11565 |
| 2017/0316984 A1* | 11/2017 | Lin ................. H01L 21/823481 |

* cited by examiner

FIN-FET DEVICES AND FABRICATION METHODS THEREOF

CROSS-REFERENCES TO RELATED APPLICATIONS

This application claims the priority of Chinese Patent Application No. CN201610884434.1, filed on Oct. 10, 2016, the entire content of which is incorporated herein by reference.

FIELD OF THE DISCLOSURE

The present disclosure generally relates to the field of semiconductor fabrication technology and, more particularly, relates to Fin-FET devices and fabrication methods thereof.

BACKGROUND

In the semiconductor manufacturing, as very-large-scale integration (VLSI) becomes a development trend, the feature size of integrated circuits (ICs) continuously decreases. In order to accommodate the reduction of the feature size, the channel length in metal-oxide-semiconductor field-effect transistors (MOSFETs) is correspondingly reduced. However, as the channel length of a device decreases, the distance between the source and the drain in the device is shortened, which leads to deteriorated gate-to-channel control ability. Therefore, it is more difficult for the gate voltage to pinch off the channel, and the subthreshold leakage phenomenon, i.e. the short-channel effects (SCEs), more likely occur.

In order to better accommodate the reduction of the feature size, the semiconductor technology begins a gradual transition from planar MOSFET transistors to more efficient three-dimensional transistors, such as fin field-effect transistors (Fin-FETs). In a Fin-FET device, the gate electrode is able to control an ultra-thin structure (i.e. fin structure) at least from the both sides of the ultra-thin structure. Therefore, compared to traditional planar MOSFET devices, Fin-FET devices may demonstrate better gate-to-channel control ability, and thus may suppress the SCEs effectively.

However, it is still desirable to improve the electrical performance and the stability of conventional Fin-FET devices. The disclosed Fin-FET devices and fabrication methods thereof are directed to solve one or more problems set forth above and other problems in the art.

BRIEF SUMMARY OF THE DISCLOSURE

One aspect of the present disclosure includes a method for fabricating a Fin-FET device. The method includes forming a plurality of fin structures on a substrate, forming an isolation film on the substrate between neighboring fin structures, removing a portion of the isolation film to form an initial isolation layer with a top surface of the initial isolation layer lower than top surfaces of the fin structures, and implanting doping ions into the initial isolation layer. Further, the method also includes removing a portion of the initial isolation layer to form an isolation layer.

Another aspect of the present disclosure provides a Fin-FET device. The Fin-FET device includes a substrate and a plurality of fin structures formed on the substrate. The Fin-FET device also includes an isolation layer formed on the substrate between neighboring fin structures. The top surface of the isolation layer is lower than the top surfaces of the plurality of fin structures. The isolation layer is formed from by removing a portion of an initial isolation layer after implanting doping ions into the initial isolation layer. Moreover, the initial isolation layer, with a top surface lower than the top surfaces of the plurality of fin structures, is formed by removing a portion of an isolation film formed on the substrate between neighboring fin structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

It is desirable to improve electrical performance and stability of Fin-FET devices. An example is provided herein to illustrate the reasons that improvement is needed for Fin-FET devices.

When forming a Fin-FET device, ions may be implanted into the fin structures to adjust the threshold voltage. However, because the fin structures protrude from the surface of the substrate, ion-implantation shadow effect may be easily occur when implanting ions into the fin structures.

Figure 1:
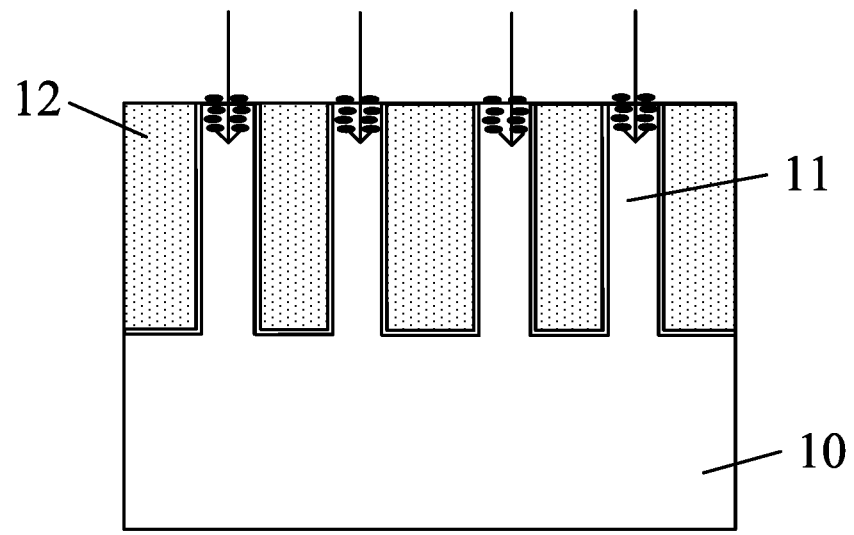
FIG. 1 illustrates a schematic diagram of an ion implantation process used in a method for fabricating Fin-FET devices.

To reduce the ion-implantation shadow effect, the Fin-FET devices may be fabricated through a method schematically illustrated in FIG. 1. The fabrication method includes forming a base structure (not labeled) including a substrate 10 and a plurality of fin structures 11 formed on the substrate 10, forming an isolation layer 12 on the substrate 10 between neighboring fin structures 11 with a top surface leveled with the top surfaces of the fin structures 11, and implanting ions into the plurality of fin structures 11 along a direction perpendicular to the surface of the substrate to adjust the threshold voltage of the subsequently-formed Fin-FET devices.

Referring to FIG. 1, by implanting ions into the fin structures 11 along the direction perpendicular to the surface of the substrate, the shadow effect may be avoided. However, because the ions are directly implanted into the fin structures, the doping ions with high energy and used in the ion implantation process may easily cause implantation damages to the surfaces of the fin structures, leading to undesired surface profile of the fin structures 11 and also causing lattice damages to the fin structures 11. Therefore, the quality and the performance of the subsequently-formed transistors may be degraded. Moreover, the damages in the fin structures 11 cannot be recovered through subsequent fabrication process, and thus the electrical performance and the stability of the subsequently-formed transistors are degraded.

Figure 8:
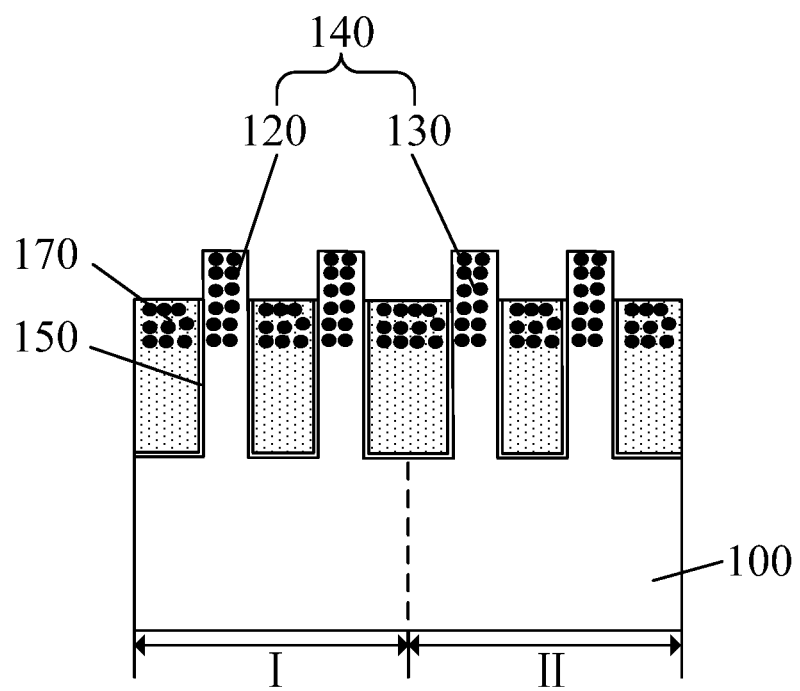
Figure 9:
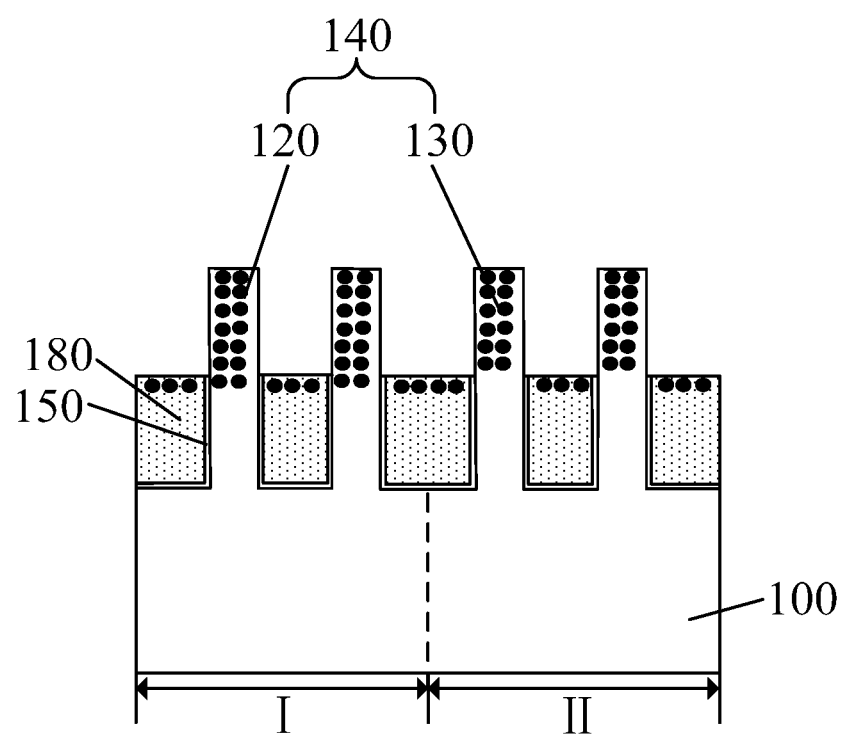
Figure 10:
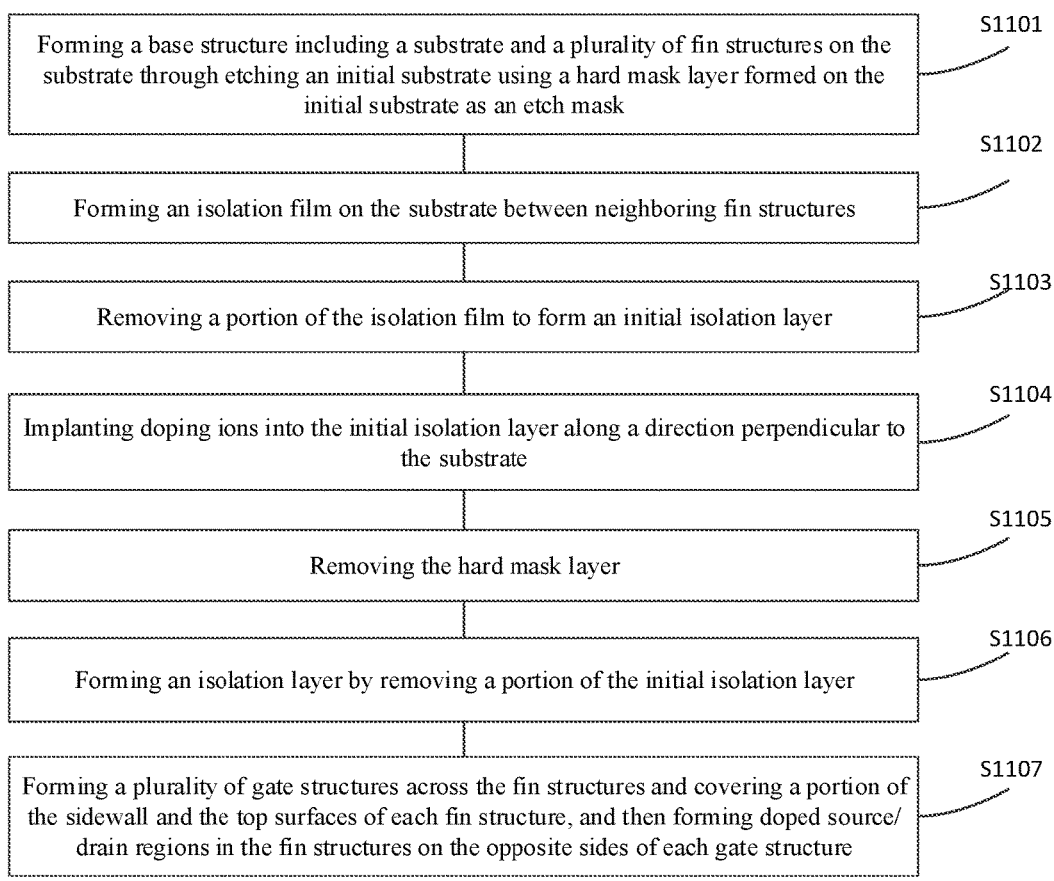
FIG. 10 illustrates a flowchart of an exemplary method for fabricating Fin-FET devices consistent with various disclosed embodiments in the present disclosure.

The present disclosure provides Fin-FET devices and methods for fabricating Fin-FET devices. FIG. 10 shows a flowchart of an exemplary method for fabricating Fin-FET devices consistent with various disclosed embodiments in the present disclosure. FIGS. 2-9 show schematic cross-section views of semiconductor structures at certain stages of the exemplary method.

Figure 2:
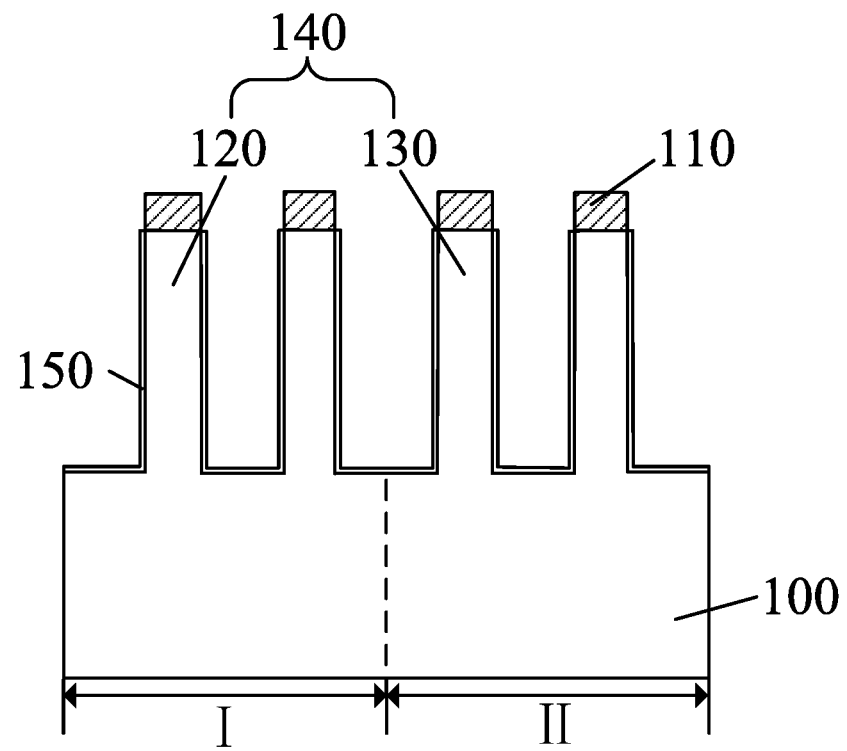
FIGS. 2-9 illustrate schematic cross-section views of semiconductor structures at certain stages of an exemplary method for fabricating Fin-FET devices consistent with various disclosed embodiments in the present disclosure.

Referring to FIG. 10, at the beginning of the fabrication process, a base structure including a substrate and a plurality of fin structures may be formed (S1101). FIG. 2 shows a schematic cross-section view of a semiconductor structure including an exemplary base structure.

Referring to FIG. 2, a base structure (not labeled) is formed. The base structure may be used to provide a process platform for subsequent fabrication processes. The base structure may be made of silicon, germanium, SiGe, SiC, GaAs, InAs, or any other appropriate semiconductor material. The base structure may also be made of silicon on insulator (SOI), germanium on insulator (GOI), SiGe on insulator, or any other appropriate semiconductor structure. In one embodiment, the base structure is made of silicon.

Further, the base structure may include a first region I used to form N-type transistors and a second region II used to form P-type transistors, or vice versa. The first region I and the second region II may be arranged next to each other.

In other embodiments, the base structure may only be used to form N-type devices or only be used to form P-type devices. Moreover, in other embodiments, the first region I may be separated from the second region II. That is, the first region I and the second region II may not be arranged next to each other.

The base structure may include a substrate 100 and a plurality of fin structures 140 formed on the substrate 100.

The substrate 100 and the plurality of fin structures 140 may be formed from an initial substrate (not shown) through an etching process. For example, the base structure may be formed by a process including the following steps. First, an initial substrate is provided. A hard mask layer 110 may be formed on the initial substrate. The hard mask layer 110 may be used to define the positions and the dimensions of the subsequently-formed fin structures 140. Further, an etching process using the hard mask layer 110 as an etch mask may be performed on the initial substrate to form the substrate 100 and the plurality of fin structures 140 on the substrate 100.

In one embodiment, the hard mask layer 110 may be used as the etch mask during the etching process performed on the initial substrate to form the substrate 100 and the plurality of fin structures 140. In addition, the hard mask layer 110 may also provide protection for the plurality of fin structures 140 during a subsequently-performed ion implantation process. Alternatively, the hard mask layer 110 may provide protection for the fin structures 140 during a subsequently-performed planarization process.

In one embodiment, the hard mask layer 110 may be made of $SiN_x$. The process to form the hard mask layer 110 may include forming an initial hard mask layer (not shown) on the initial substrate, forming a patterned photoresist layer (not shown) on the surface of the initial hard mask layer, forming the hard mask layer 110 by etching the initial hard mask layer using the patterned photoresist layer as an etch mask, and then removing the patterned photoresist layer. In other embodiments, the process to form the hard mask layer may include a self-aligned double patterned (SADP) process, a self-aligned triple patterned (SATP) process, or a self-aligned double double patterned (SADDP) process. Moreover, the SADP process may include a litho-etch-litho-etch (LELE) process or a litho-litho-etch (LEE) process.

In one embodiment, the plurality of fin structures 140 may further include a plurality first fin structures 120 formed on the substrate 100 in the first region I and a plurality of second fin structures 130 formed on the substrate 100 in the second region II.

In one embodiment, after forming the plurality of fin structures 140 and prior to forming an isolation film, the fabrication method may also include forming a linear oxide layer 150 on the sidewall surfaces of the fin structures 140 and also on the portion of the substrate 100 between neighboring fin structures 140.

Further, because the plurality of fin structures 140 may be formed by etching an initial substrate, the formed fin structures 140 may have protruding edges and corners as well as surface defects. In one embodiment, an oxygen treatment process may be performed on the plurality of fin structures 140 to form a linear oxide layer 150. The protruding edges and corners have a large specific surface area, and thus may be more easily oxidized during the oxygen treatment process. Therefore, after removing the linear oxide layer 150, in addition to removing the defect layer formed at the surfaces of the fin structures 140, the protruding edges and corners may also be removed such that the surfaces of the fin structures 140 may become smooth and/or rounded. Therefore, the lattice quality may be improved and point discharge from the fin structures 140 may be avoided. Moreover, the formed linear oxide layer 150 may be conducive to improving the properties of the interface between a subsequently-formed isolation layer and each fin structure 140.

In one embodiment, the thickness of the linear oxide layer 150 may not be too small or too large. Specifically, a very small thickness of the linear oxide layer 150 indicates that the protruding edges and corners of the fin structures 140 and the surface defects of the fin structures 140 may not fully form the linear oxide layer 150. Therefore, when the thickness of the linear oxide layer 150 is too small, during the subsequently-performed process to remove the linear oxide layer 150, a portion of the defect layer at the surface of the fin structures 140 and a portion of protruding edges and corners may be hardly removed. Moreover, the surfaces of the fin structures 140 may not be smoothened and the lattice quality may not be improved. Therefore, the problem of point discharge from the fin structures 140 may not be solved. However, because the linear oxide layer 150 is formed through an oxidation process performed on the fin structures 140, when the thickness of the linear oxide layer 150 is too large, an excessive portion of the fin structures 140 may be consumed during the fabrication process, which may further degrade the performance of the transistors. In one embodiment, the thickness of the formed linear oxide layer 150 may be in a range of approximately 15 Å to 40 Å.

Figure 3:
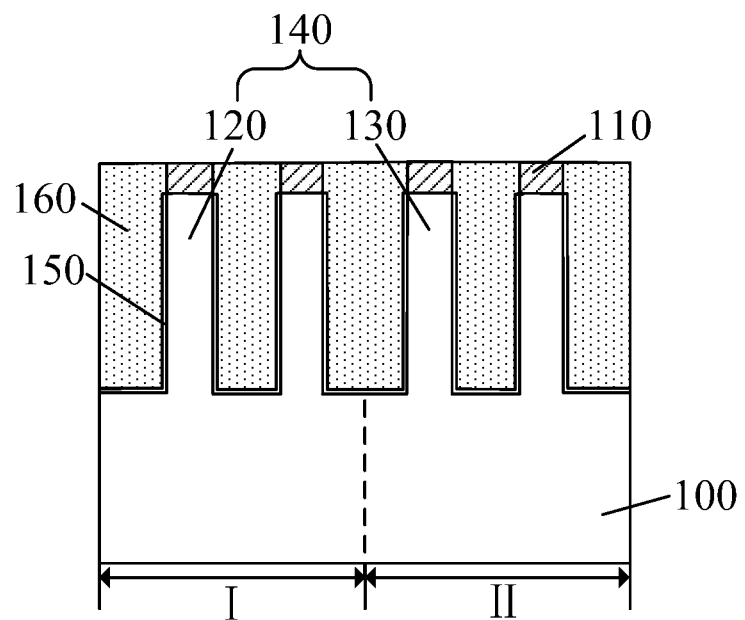

Further, returning to FIG. 10, an isolation film may be formed on the substrate between neighboring fin structure (S1102). FIG. 3 shows a schematic cross-section view of a corresponding semiconductor structure.

Referring to FIG. 3, an isolation film 160 may be formed on the substrate 100 between neighboring fin structures 140. The isolation film 160 may be used to provide a process basis for forming an isolation layer in a subsequent process. Further, the isolation film 160 may be made of an insulating material such as $SiO_x$, $SiN_x$, SiON, etc. In one embodiment, the isolation film 160 may be made of $SiO_x$.

In order to improve the gap-filling ability of the process to form the isolation film 160, the isolation film 160 may be formed by flowable chemical vapor deposition (FCVD) or high aspect ratio process (HARP) chemical vapor deposition (CVD).

In one embodiment, the isolation film 160 may be formed by a process including the following steps. First, an isolation material layer (not shown) may be formed on the surface of the linear oxide layer 150. The top surface of the isolation material layer may be higher than the top surface of the hard mask layer 110. Then, a planarization process may be performed to remove the portion of the isolation material layer formed on the top of the hard mask layer 110 to form the isolation film 160.

Moreover, during the planarization process, the hard mask layer 110 formed on the fin structures 140 may provide protection for the top surfaces of the fin structures 140.

Figure 4:
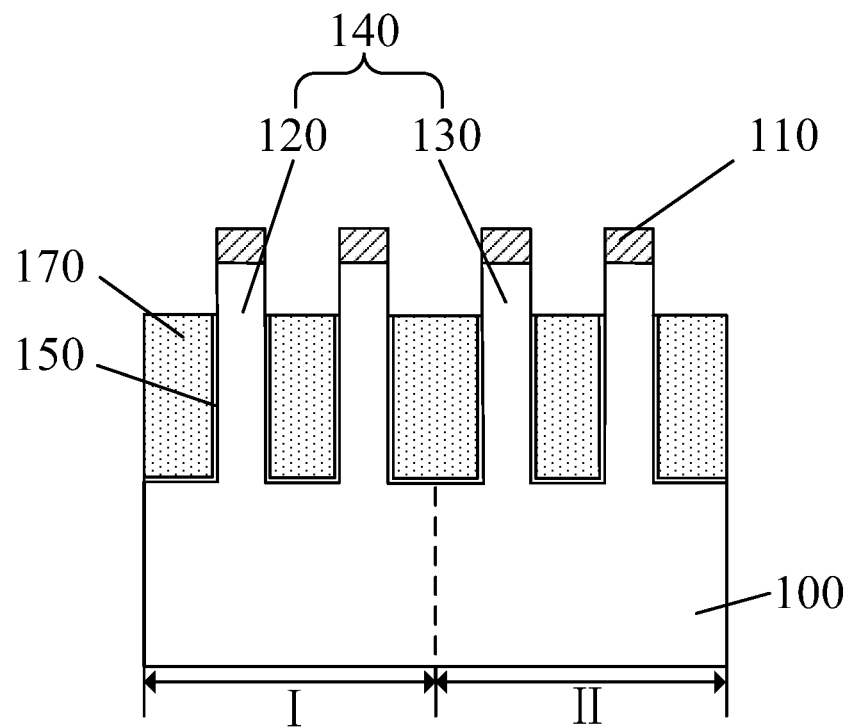

Further, returning to FIG. 10, a portion of the isolation film may be removed to form an initial isolation layer (S1103). FIG. 4 shows a schematic cross-section view of a corresponding semiconductor structure.

Referring to FIG. 4, a portion of the isolation film 160 (referring to FIG. 3) may be removed to form an initial isolation layer 170. The top surface of the initial isolation layer 170 may be lower than the top surfaces of the fin structures 140.

In one embodiment, after removing a portion of the isolation film 160 (referring to FIG. 3) to form the initial isolation layer 170, the top surface of the formed initial isolation layer 170 may correspond to the desired doping position in the fin structures 140. As such, after implanting ions into the initial isolation layer 170, the implanted ions may diffuse into the desired doping position in the fin structures 140.

In one embodiment, the initial isolation layer 170 may be made of $SiO_x$. The portion of the isolation film 160 may be removed by a SiCoNi etching process. The SiCoNi etching process may use an etch gas formed by a dilution gas including Helium gas and a reaction gas including $NF_3$ and $NH_3$. Then, the portion of the isolation film 160 may be removed by the etch gas and by-products may also be simultaneously formed. Further, an annealing process may be performed to vaporize and decompose the by-products. Finally, the vaporized by-products may be removed, e.g., through pumping.

In one embodiment, the linear oxide layer 150 may be made of $SiO_x$. Moreover, during the process to remove the portion of the isolation film 160, a portion of the linear oxide layer 150 may also be removed such that the top surface of the remaining portion of the linear oxide layer 150 may be leveled with the top surface of the initial isolation layer 170.

In one embodiment, the initial isolation layer 170 may need to expose at least the hard mask layer 110. In addition, during the subsequently-performed ion implantation process, the doping ions may need to diffuse into a desired position in the fin structures 140 in order to effectively adjust the performance of the transistors. Therefore, during the process to form the initial isolation layer 170, the top surface of the formed initial isolation layer 170 may be approximately 100 Å to 300 Å lower than the top surfaces of the fin structures 140.

In one embodiment, in order to remove the desired amount of the isolation film 160 to ensure the formed initial isolation layer 170 expose at least the hard mask layer 110 and a portion of the fin structures 140 and also ensure the thickness of the subsequently-formed isolation layer reach a desired value, each process parameter used in the etching process may need to be controlled in a reasonable range. For example, the process parameters used in the SiCoNi etching process may include a flow rate of Helium gas in a range of approximately 600 sccm to 2000 sccm, a flow rate of $NF_3$ in a range of approximately 20 sccm to 200 sccm, a flow rate of $NH_3$ in a range of approximately 100 sccm to 500 sccm, a chamber pressure in a range of approximately 0.01 Torr to 50 Torr, and a process time in a range of approximately 20 seconds to 300 seconds. In other embodiments, the portion of the isolation film may be removed by a dry etching process, a wet etching process, or an etching process combing dry etching with wet etching.

Figure 5:
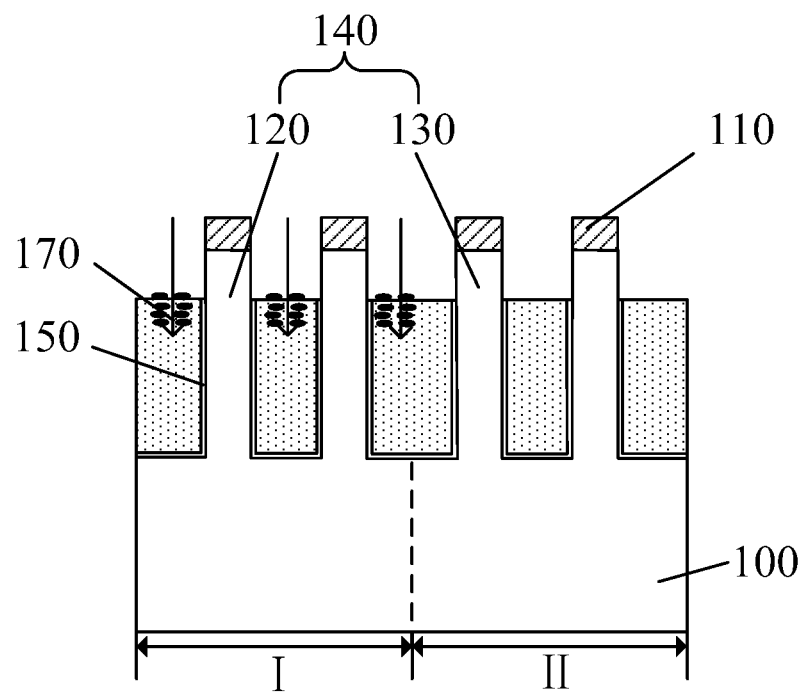
Figure 6:
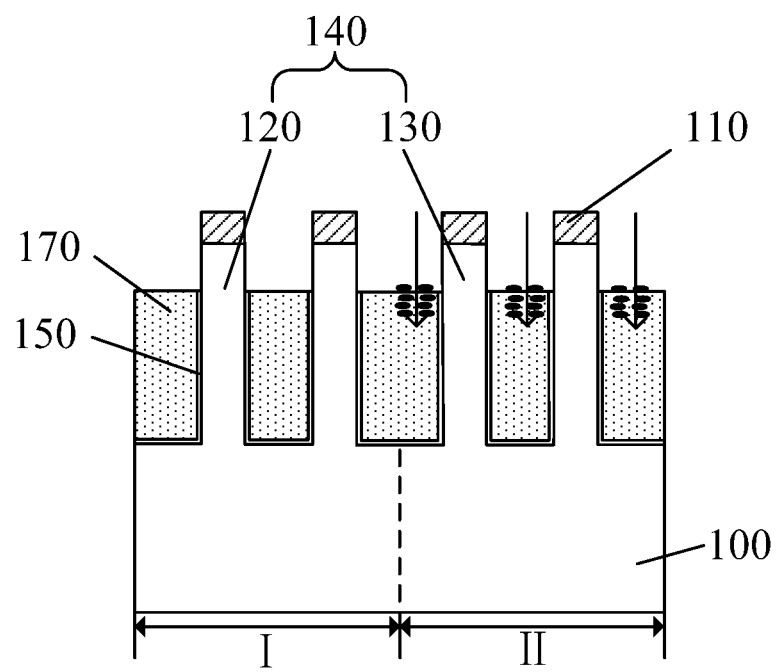
Figure 7:
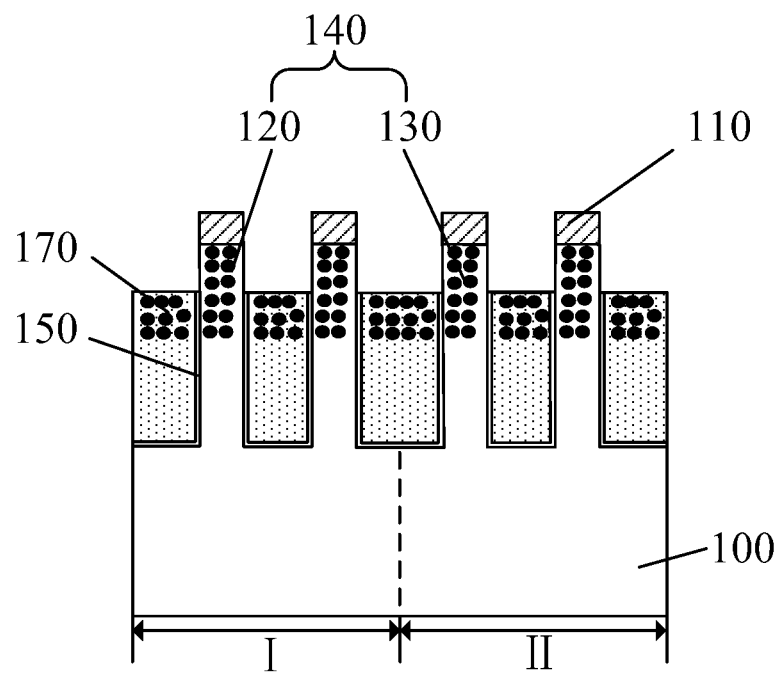

Further, returning to FIG. 10, doping ions may be implanted into the initial isolation layer along a direction perpendicular to the surface of the substrate (S1104). FIGS. 5-6 show schematic diagrams of implanting ions into the initial isolation layer.

Referring to FIGS. 5-6, doping ions may be implanted into the initial isolation layer 170. During the ion implantation process, doping ions may diffuse laterally along directions parallel to the surface of the substrate 100 to enter the plurality of fin structures 140, and may thus doped into the plurality of fin structures 140. Therefore, the plurality of fin structures 140 may be effectively protected during the ion implantation process so that damages to the fin structures 140 may be avoided. As such, degradation of the performance of the formed transistors due to damages to the fin structures 140 may be avoided, and the stability of the transistors may be improved.

In one embodiment, the doping ions may be implanted into the initial isolation layer 170 along a direction perpendicular to the surface of the substrate 100. Therefore, the ion-implantation shadow effect due to protruding fin structures may be avoided, which prevents ineffective implantation of the doping ions into the plurality of fin structures 140. As such, the plurality of fin structures 140 may be effectively and precisely implanted with doping ions. Therefore, the electrical performance of the transistors may be improved.

In other embodiments, implanting the doping ions into the initial isolation layer along a direction within a small angle to the normal direction of the surface of the substrate may also be able to reduce the ion implantation shadow effect. For example, the initial isolation layer may also be implanted along a direction within 5 degrees to the normal direction of the surface of the substrate.

In one embodiment, during the ion implantation process, the hard mask layer 110 situated on the top surfaces of the fin structures 140 may provide protection for the top of the fin structures, and thus further reduce the damages to the fin structures 140 during the ion implantation process.

In one embodiment, the type of the doping ions may be suitable for adjusting the threshold voltage of the Fin-FET device. Therefore, the type of the doping ions implanted into the initial isolation layer 170 may be opposite to the type of the transistor to be formed. Specifically, when the transistors to be formed are N-type transistors, the doping ions may be P-type ions, such as boron ions. When the transistors to be formed are P-type transistors, the doping ions may be N-type ions, such as phosphor ions and arsenic ions.

For example, referring to FIG. 5, the substrate 100 may include a first region I used to form N-type Fin-FETs and a second region II used to form P-type Fin-FETs. The portion of the initial isolation layer 170 formed on the substrate 100 in the first region I may be implanted along a direction perpendicular to the surface of the substrate 100. The ion source used in the ion implantation process may be a $BF_2$ ion source. In addition, the implantation energy may be in a range of approximately 2 keV to 35 keV and the implantation dose may be in a range of approximately 1.0E13 atom/cm$^2$ to 5.0E14 atom/cm$^2$. Alternatively, the ion source used in the ion implantation process may be a boron ion source, the implantation energy may be in a range of approximately 1 keV to 15 keV, and the implantation dose may be in a range of approximately 1.0E13 atom/cm$^2$ to 5.0E14 atom/cm$^2$.

In one embodiment, prior to implanting ions into the first region I, a first blocking layer (not shown) may be formed to cover the second region II and expose the first region I. The portion of the initial isolation layer 170 formed on the substrate in the first region I may be implanted by using the first blocking layer as a mask during the ion implantation process.

Further, referring to FIG. 6, the portion of the initial isolation layer 170 formed on the substrate 100 in the second region II may be implanted along the direction perpendicular to the surface of the substrate 100. The ion source used for ion implantation may be a phosphor ion source. In addition, the implantation energy may be in a range of approximately 2 keV to 25 keV, and the implantation dose may be in a range of approximately 1.0E13 atom/cm$^2$ to 5.0E14 atom/cm$^2$. Alternatively, the ion source used for ion implantation may be an arsenic ion source, the implantation energy may be in a range of approximately 5 keV to 40 keV, and the implantation dose may be in a range of approximately 1.0E13 atom/cm$^2$ to 5.0E14 atom/cm$^2$.

In one embodiment, prior to implanting ions into the second region II, a second blocking layer (not shown) may be formed to cover the first region I and expose the second region II. The portion of the initial isolation layer 170 formed on the substrate in the second region II may be implanted by using the second blocking layer as a mask during the ion implantation process.

In one embodiment, after implanting ions into the initial isolation layer 170 but prior to removing the hard mask layer 110, an annealing process may be performed.

After performing the annealing process, the doped ions may be relaxed to the lattice sites, and thus be activated. As such, the doped ions may more easily and more effectively diffuse into the fin structures 140. Through the annealing process, the doped ions may diffuse laterally (along directions parallel to the surface of the substrate 100) and vertically (along a direction perpendicular to the surface of the substrate 100) such that the goal to adjust the threshold voltage of the transistors may be achieved and the performance of the transistors may be optimized.

The annealing process may be a process of tube annealing, rapid annealing, or spike annealing. In one embodiment, the annealing process may include using spike annealing to anneal the semiconductor structure. Moreover, the process parameters adapted in the annealing process may include an anneal temperature in a range of approximately 950° C. to 1100° C. and an anneal time in a range of 0 second to approximately 30 seconds.

In other embodiments, the semiconductor structure may not be annealed because after performing the ion implantation process, the implanted ions may diffuse into the adjacent fin structures even without performing an additional annealing process.

Further, returning to FIG. 10, the hard mask layer may be removed (S1105). FIG. 8 shows a schematic cross-section view of a corresponding semiconductor structure.

Referring to FIG. 8, the hard mask layer 110 (referring to FIG. 7) may be removed. In one embodiment, the hard mask layer 110 may be made of $SiN_x$, and the hard mask layer 110 may be removed by a wet etching process using an etch solution including a phosphoric acid.

In one embodiment, the phosphoric acid may be used to remove the $SiN_x$-made hard mask layer 110. In addition, because the linear oxide layer 150 may be formed on the sidewall of the exposed portion of the fin structures 140, the fin structures 140 may not be easily damaged by the phosphoric acid. Therefore, the structural and morphological integrity as well as the dimensional precision of the fin structures 140 may be ensured, and thus the subsequently-formed transistors may demonstrate improved stability.

Further, returning to FIG. 10, a portion of the initial isolation layer may be removed to form an isolation layer (S1106). FIG. 9 shows a schematic cross-section view of a corresponding semiconductor structure.

Referring to FIG. 9, a portion of the initial isolation layer 170 (referring to FIG. 8) may be removed to form an isolation layer 180. Through the removal process, the thickness of the formed isolation layer 180 may reach a preset value. As such, an isolation layer 180 providing sufficient isolation for the neighboring fin structures 140 may be formed. In some embodiments, the isolation layer 180 may include doping ions in an amount such that the implanted isolation layer may provide sufficient isolation for the neighboring fin structures.

In one embodiment, during the process to form the isolation layer 180, the top surface of the formed isolation layer 180 may be approximately 300 Å to 500 Å lower than the top surfaces of the fin structures 140.

In one embodiment, the portion of the initial isolation layer 170 may be removed by a SiCoNi etching process. For example, the SiCoNi etching process may use an etch gas formed by a dilution gas including Helium gas and a reaction gas including $NF_3$ and $NH_3$. Then, a portion of the initial isolation layer 170 (referring to FIG. 8) may be removed by the etch gas and by-products may also be simultaneously formed. Further, an annealing process may be performed to vaporize and decompose the by-products. Finally, the vaporized by-products may be removed, e.g., through pumping.

In one embodiment, the process parameters used in the SiCoNi etching process may include a flow rate of Helium gas in a range of approximately 600 sccm to 2000 sccm, a flow rate of $NF_3$ in a range of approximately 20 sccm to 200 sccm, a flow rate of $NH_3$ in a range of approximately 100 sccm to 500 sccm, a chamber pressure in a range of approximately 0.01 Torr to 50 Torr, and a process time in a range of approximately 20 seconds to 500 seconds. In other embodiments, the portion of the isolation film may be removed by a dry etching process, a wet etching process, or an etching process combing dry etching and wet etching.

Further, returning to FIG. 10, a plurality of gate structures may be formed across the fin structures and covering a portion of the sidewall and the top surface of each fin structure, and then doped source/drain regions may be formed in the fin structures on the opposite sides of each gate structure (S1107).

The plurality of gate structures and the corresponding doped source/drain regions may be fabricated by any appropriate methods for fabricating gate structures and doped source/drain regions.

In one embodiment, each gate structure may include a gate dielectric layer formed across the corresponding fin structure and covering a portion of the sidewall and the top surfaces of the fin structure, and a gate electrode formed on the gate dielectric layer. Moreover, each gate structure may also include a work function layer formed between the gate dielectric layer and the gate electrode. The work function layer may be an N-type work function layer or a P-type work function layer depending on the type of the transistor to be formed.

Moreover, the process to form the plurality of doped source/drain regions may include forming a plurality of trenches in the fin structures 140 (referring to FIG. 9) on the two opposite sides of each gate structure and then forming the plurality of doped source/drain regions in the trenches. The plurality of doped source/drain regions may be formed in the trenches through an epitaxial growth process. In one embodiment, the doping ions may be implanted into the plurality of doped source/drain regions through an in-situ process. That is, the doping ions may be introduced during the epitaxial growth process. In other embodiments, the doping ions may be introduced after the epitaxial growth process.

In one embodiment, damages to the fin structure 140 in the formed Fin-FET device during the ion implantation process may be reduced or eliminated, and doping ions may be directly implanted into the initial isolation layer 170. Therefore, the shadow effect due to protruding fin structures 140 may be reduced, and thus the electrical performance and the stability of the formed Fin-FET device may be improved.

Compared to existing Fin-FET devices and fabrication methods, the disclosed Fin-FET devices and fabrication methods in the present disclosure may demonstrate the following advantages.

For example, according to the disclosed methods for fabricating Fin-FET devices, in order to introduce doping ions into the fin structures, doping ions are implanted into the initial isolation layer first, and then the implanted ions may diffuse into the fin structures along lateral directions (i.e. directions parallel to the surface of the substrate). Therefore, because the doping ions may be implanted into the initial isolation layer, instead of directly into the fin structure, the ion implantation process may be less difficult. Moreover, as doping ions may not be directly implanted into the fin structures, damages to the fin structures during the ion implantation process may be reduced, and thus the electrical performance and the stability of the formed Fin-FET devices may be improved.

Further, by performing the ion implantation process along a direction perpendicular to the surface of the substrate to implant doping ions into the initial isolation layer, the shadow effect due to the protruding fin structures may be avoided, preventing the doping ions from being ineffectively implanted into the plurality of fin structures. Therefore, the doping ions may be precisely and effectively implanted into the plurality of fin structures, and thus the electrical performance of the transistors may be improved.

Moreover, during the fabrication process, a hard mask layer may be formed on an initial substrate, and the substrate and the plurality of fin structures may then be formed by etching the initial substrate using the hard mask layer as an etch mask. Further, the hard mask layer may be removed after implanting doping ions into the initial isolation layer. Therefore, the hard mask layer may provide protection for the top surfaces of the fin structures, preventing damages to the fin structures during the ion implantation process. As such, the electrical performance and the stability of the formed Fin-FET devices may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (Fin-FET) device, comprising:
    forming a plurality of fin structures on a substrate;
    forming an isolation film on the substrate between neighboring fin structures;
    removing a portion of the isolation film to form an initial isolation layer with a top surface of the initial isolation layer lower than top surfaces of the fin structures;
    implanting doping ions into the initial isolation layer;
    performing an annealing process to diffuse the doping ions from the initial isolation layer laterally and vertically into the fin structures; and
    removing a portion of the initial isolation layer to form an isolation layer.

2. The method for fabricating the Fin-FET device according to claim 1, wherein:
    the doping ions are implanted into the initial isolation layer along a direction within 5 degrees to a normal direction of a surface of the substrate.

3. The method for fabricating the Fin-FET device according to claim 2, wherein:
    the doping ions are implanted into the initial isolation layer along a direction perpendicular to the surface of the substrate.

4. The method for fabricating the Fin-FET device according to claim 3, wherein:
    when the doping ions are boron ions, an ion implantation process uses a $BF_2$ ion source with an implantation energy in a range of approximately 2 keV to 35 keV and an implantation dose in a range of approximately $1.0E13$ atom/cm$^2$ to $5.0E14$ atom/cm$^2$, or uses a boron ion source with an implantation energy in a range of approximately 1 keV to 15 keV and an implantation dose in a range of approximately $1.0E13$ atom/cm$^2$ to $5.0E14$ atom/cm$^2$;
    when the doping ions are phosphor ions, an ion implantation process uses a phosphor ion source with an implantation energy in a range of approximately 2 keV to 25 keV and an implantation dose in a range of approximately $1.0E13$ atom/cm$^2$ to $5.0E14$ atom/cm$^2$; and
    when the doping ions are arsenic ions, an ion implantation process uses an arsenic ion source with an implantation energy in a range of approximately 5 keV to 40 keV and an implantation dose in a range of approximately $1.0E13$ atom/cm$^2$ to $5.0E14$ atom/cm$^2$.

5. The method for fabricating the Fin-FET device according to claim 2, wherein:
    when the Fin-FET device is an N-type transistor device, the doping ions are boron ions; and
    when the Fin-FET device is a P-type transistor device, the doping ions are phosphor ions or arsenic ions.

6. The method for fabricating the Fin-FET device according to claim 1, wherein:
    the top surface of the initial isolation layer corresponds with a doping position in the fin structures.

7. The method for fabricating the Fin-FET device according to claim 1, wherein etching the initial substrate to form the substrate and the plurality of fin structures on the substrate includes:
 forming a hard mask layer on the initial substrate;
 etching the initial substrate using the hard mask layer as an etch mask to form the substrate and the plurality of fin structures; and
 removing the hard mask layer prior to forming the isolation layer.

8. The method for fabricating the Fin-FET device according to claim 1, wherein, by removing the portion of the isolation film, the initial isolation layer has a top surface approximately 100 Å to 300 Å lower than the top surfaces of the fin structures.

9. The method for fabricating the Fin-FET device according to claim 1, wherein by removing the portion of the initial isolation layer, the isolation layer has a top surface approximately 300 Å to 500 Å lower than the top surfaces of the fin structures.

10. The method for fabricating the Fin-FET device according to claim 1, further comprising:
 performing a SiCoNi etching process to remove the portion of the isolation film to form the initial isolation layer and/or to remove the portion of the initial isolation layer to form the isolation layer.

11. The method for fabricating the Fin-FET device according to claim 10, wherein process parameters adapted in the SiCoNi etching process to remove the portion of the isolation film include:
 a flow rate of Helium gas in a range of approximately 600 sccm to 2000 sccm;
 a flow rate of $NF_3$ in a range of approximately 20 sccm to 200 sccm;
 a flow rate of $NH_3$ in a range of approximately 100 sccm to 500 sccm;
 a chamber pressure in a range of approximately 0.01 Torr to 50 Torr; and
 a process time in a range of approximately 20 seconds to 300 seconds.

12. The method for fabricating the Fin-FET device according to claim 10, wherein process parameters adapted in the SiCoNi etching process to remove the portion of the initial isolation layer include:
 a flow rate of Helium gas in a range of approximately 600 sccm to 2000 sccm;
 a flow rate of $NF_3$ in a range of approximately 20 sccm to 200 sccm;
 a flow rate of $NH_3$ in a range of approximately 100 sccm to 500 sccm;
 a chamber pressure in a range of approximately 0.01 Torr to 50 Torr; and
 a process time in a range of approximately 20 seconds to 500 seconds.

13. The method for fabricating the Fin-FET device according to claim 1, wherein:
 the substrate includes a first region to form a plurality of N-type transistors and a second region to form a plurality of P-type transistors, and
 implanting the doping ions into the initial isolation layer includes:
  implanting boron ions into the initial isolation layer in the first region; and
  implanting phosphor ions or arsenic ions into the initial isolation layer in the second region.

14. The method for fabricating the Fin-FET device according to claim 1, after forming the fin structures on the substrate and prior to forming the isolation film, further including: forming a linear oxide layer on sidewall surfaces of the fin structures and on the substrate between neighboring fin structures.

15. The method for fabricating the Fin-FET device according to claim 14, wherein:
 a thickness of the linear oxide layer is in a range of approximately 15 Å to 40 Å.

16. A Fin-FET device manufactured with the method of claim 1, the device comprising:
 a substrate;
 a plurality of fin structures formed on the substrate; and
 an isolation layer formed on the substrate between neighboring fin structures with a top surface lower than top surfaces of the plurality of fin structures, wherein:
 the isolation layer is formed by removing a portion of an initial isolation layer after implanting doping ions into the initial isolation layer;
 an annealing process is performed to diffuse the doping ions from the initial isolation layer laterally and vertically to the fin structures and the initial isolation layer, with a top surface lower than the top surfaces of the plurality of fin structures, is formed by removing a portion of an isolation film formed on the substrate between neighboring fin structures.

17. The Fin-FET device according to claim 16, wherein:
 when the Fin-FET device is an N-type transistor device, the doping ions are boron ions; and
 when the Fin-FET device is a P-type transistor device, the doping ions are phosphor ions or arsenic ions.

18. The Fin-FET device according to claim 16, wherein the isolation layer has a top surface approximately 300 Å to 500 Å lower than the top surfaces of the fin structures.

19. A method for fabricating a fin field-effect transistor (Fin-FET) device, comprising:
 forming a plurality of fin structures on a substrate, wherein etching an initial substrate to form the substrate and the plurality of fin structures on the substrate includes:
  forming a hard mask layer on the initial substrate; and
  etching the initial substrate using the hard mask layer as an etch mask to form the substrate and the plurality of fin structures;
 forming an isolation film on the substrate between neighboring fin structures;
 removing a portion of the isolation film to form an initial isolation layer with a top surface of the initial isolation layer lower than top surfaces of the fin structures;
 implanting doping ions into the initial isolation layer;
 after implanting the doping ions into the initial isolation layer and prior to removing the hard mask layer, performing an annealing process including one of spike annealing, rapid annealing, and tube annealing;
 removing the hard mask layer prior to forming the isolation layer; and
 removing a portion of the initial isolation layer to form an isolation layer.

20. The method for fabricating the Fin-FET device according to claim 7, wherein the annealing process is a spike annealing process, and process parameters used in the spike annealing process include:
 an anneal temperature in a range of approximately 950° C. to 1100° C.; and
 an anneal time in a range of 0 second to approximately 30 seconds.

* * * * *